United States Patent [19]
Kadosh et al.

[11] Patent Number: 5,923,982
[45] Date of Patent: *Jul. 13, 1999

[54] METHOD OF MAKING ASYMMETRICAL TRANSISTOR WITH LIGHTLY AND HEAVILY DOPED DRAIN REGIONS AND ULTRA-HEAVILY DOPED SOURCE REGION USING TWO SOURCE/DRAIN IMPLANT STEPS

[75] Inventors: Daniel Kadosh, Austin; Mark I. Gardner, Cedar Creek; Robert Dawson, Austin, all of Tex.

[73] Assignee: Advanced Micro Devices, Inc., Sunnyvale, Calif.

[*] Notice: This patent is subject to a terminal disclaimer.

[21] Appl. No.: 08/837,526

[22] Filed: Apr. 21, 1997

[51] Int. Cl.$^6$ ................................. H01L 21/336
[52] U.S. Cl. ...................... 438/286; 438/305; 438/306
[58] Field of Search .................... 438/231, 232, 438/257, 263, 264, 265, 286, 287, 301, 303, 305, 306, 372

[56] References Cited

U.S. PATENT DOCUMENTS

| | | | |
|---|---|---|---|
| 4,225,875 | 9/1980 | Ipri | 357/23 |
| 4,272,881 | 6/1981 | Angle | 29/571 |

(List continued on next page.)

FOREIGN PATENT DOCUMENTS

| | | |
|---|---|---|
| 0 160 255 | 11/1985 | European Pat. Off. . |
| 0 186 058 | 7/1986 | European Pat. Off. . |
| 0 187 016 A2 | 7/1986 | European Pat. Off. . |
| 0 575 099 A1 | 12/1993 | European Pat. Off. . |
| 61-194777 | 8/1986 | Japan . |
| 1-18762 | 1/1992 | Japan . |
| 08078672 | 3/1996 | Japan . |

OTHER PUBLICATIONS

Vol. 011, No. 023 (E–473) & 61 194777 A (Hitachi Ltd.) Aug. 29, 1986, Jan. 22, 1987 Patent Abstracts of Japan.

IBM Technical Disclosure Bulletin, "Process for Making Very Small, Asymmetric, Field–Effect Transistors", vol. 30, No. 3, Aug. 1987, pp. 1136–1137 (XP 000671026).

IBM Technical Disclosure Bulletin, "Low Series Resistance Source by Spacer Methods", vol. 33, No. 1A, Jun. 1, 1990, pp. 75–77 (XP 000120044).

Silicon Processing for the VLSI Era—vol. 3: The Submicron MOSFET, by S. Wolf, published by Lattice Press, Sunset Beach, CA, 1995, pp. 608–611. No Month No Needed.

(List continued on next page.)

*Primary Examiner*—Charles Bowers
*Assistant Examiner*—Jack Chen
*Attorney, Agent, or Firm*—Skjerven, Morrill, MacPherson, Franklin & Friel, L.L.P.

[57] ABSTRACT

A method of making the IGFET includes providing a semiconductor substrate, providing a gate over the semiconductor substrate, implanting lightly doped source and drain regions into the substrate, forming a source-side spacer and a drain-side spacer in close proximity to opposing sidewalls of the gate, forming a masking layer that covers the drain-side spacer and includes an opening over the source-side spacer, removing the source-side spacer, and implanting a heavily doped drain region and an ultra-heavily doped source region into the substrate after removing the source-side spacer while the drain-side spacer is present, wherein the heavily doped drain region is implanted through the masking layer and the ultra-heavily doped source region is implanted through the opening in the masking layer. Accordingly, the ultra-heavily doped source region has a greater doping concentration than that of the heavily doped drain region due to the masking layer, and a portion of the lightly doped drain region is protected from the second source/drain implant step due to the drain-side spacer. Advantageously, the IGFET has low source-drain series resistance and reduces hot carrier effects.

36 Claims, 7 Drawing Sheets

U.S. PATENT DOCUMENTS

| | | | |
|---|---|---|---|
| 4,927,777 | 5/1990 | Hsu et al. | 437/44 |
| 5,073,514 | 12/1991 | Ito et al. | 437/44 |
| 5,132,753 | 7/1992 | Chang et al. | 357/23.4 |
| 5,171,700 | 12/1992 | Zamanian | 437/44 |
| 5,200,358 | 4/1993 | Bollinger et al. | 437/180 |
| 5,286,664 | 2/1994 | Horiuchi | 437/44 |
| 5,296,398 | 3/1994 | Noda | 437/44 |
| 5,349,225 | 9/1994 | Redwine et al. | 257/336 |
| 5,364,807 | 11/1994 | Hwang | 437/44 |
| 5,366,915 | 11/1994 | Kadama | 437/43 |
| 5,397,715 | 3/1995 | Miller | 437/27 |
| 5,424,229 | 6/1995 | Oyamatsu | 437/35 |
| 5,424,234 | 6/1995 | Kwon | 437/44 |
| 5,436,482 | 7/1995 | Ogoh | 257/344 |
| 5,451,807 | 9/1995 | Fujita | 257/404 |
| 5,510,279 | 4/1996 | Chien et al. | 437/41 |
| 5,512,503 | 4/1996 | Hong | 437/43 |
| 5,512,506 | 4/1996 | Chang et al. | 437/44 |
| 5,518,940 | 5/1996 | Hodate et al. | 437/41 |
| 5,521,417 | 5/1996 | Wada | 257/390 |
| 5,525,552 | 6/1996 | Huang | 437/41 |
| 5,547,885 | 8/1996 | Ogoh | 437/44 |
| 5,547,888 | 8/1996 | Yamazaki | 437/52 |
| 5,578,509 | 11/1996 | Fujita | 437/35 |
| 5,585,293 | 12/1996 | Sharma et al. | 437/43 |
| 5,585,658 | 12/1996 | Mukai et al. | 257/344 |
| 5,607,869 | 3/1997 | Yamazaki | 437/40 |
| 5,648,286 | 7/1997 | Gardner et al. | 437/44 |
| 5,654,215 | 8/1997 | Gardner et al. | 438/286 |
| 5,656,518 | 8/1997 | Gardner et al. | 438/286 |
| 5,672,531 | 9/1997 | Gardner et al. | 437/44 |
| 5,677,224 | 10/1997 | Kadosh et al. | 437/57 |
| 5,759,897 | 6/1998 | Kadosh et al. | 438/286 |

OTHER PUBLICATIONS

U.S. Application Serial No. 08/711,382, filed Sep. 3, 1996, entitled "Asymmetrical Transistor with Lightly and Heavily Doped Drain Regions and Ultra–Heavily Doped Source Region" by Daniel Kadosh et al. (copy not enclosed). Patent #55759897.

U.S. Application Serial No. 08/711,381, filed Sep. 3, 1996, entitled "Method of Making Asymmetrical N–Channel and P–Channel Devices (as amended)" by Daniel Kadosh et al. (copy not enclosed). Patent #5677224.

METHOD OF MAKING ASYMMETRICAL TRANSISTOR WITH LIGHTLY AND HEAVILY DOPED DRAIN REGIONS AND ULTRA-HEAVILY DOPED SOURCE REGION USING TWO SOURCE/DRAIN IMPLANT STEPS

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a thermal cycle that would otherwise melt the aluminum is applied to repair crystalline damage and to drive-in and activate the implanted dopants.

As IGFET dimensions are reduced and the supply voltage remains constant (e.g., 3V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to spacers in close proximity to opposing sidewalls of the gate. The spacers are typically oxides or nitrides. The purpose of the lighter dose is to form a lightly doped region of the drain (or LDD) at the edge near the channel. The heavier dose forms a low resistivity heavily doped region of the drain. Since the heavily doped region is farther away from the channel than a conventional drain structure, the depth of the heavily doped region can be made somewhat greater without adversely affecting the device characteristics. The lightly doped source region is not necessary unless bidirectional current is used, however lightly doped source and drain regions are both typically formed to avoid additional processing steps.

Disadvantages of LDDs include increased fabrication complexity and increased parasitic resistance due to their light doping levels. During operation, LDD parasitic resistance decreases drain current. Linear drain current (i.e., drain current in the linear or triode region) is reduced by the parasitic resistance in both the source and drain. Saturation drain current (i.e., drain current in the saturation region) is largely unaffected by the parasitic resistance of the drain but can be greatly reduced by the parasitic resistance of the source. Adequate saturation drain current and reduced hot carrier effects can be obtained by providing a lightly doped region on the drain side only. That is, the drain includes lightly and heavily doped regions, and the entire source is heavily doped.

Asymmetrical IGFETs (with lightly doped drain regions without lightly doped source regions) are known in the art. For instance, U.S. Pat. No. 5,424,229 entitled "Method For Manufacturing MOSFET Having An LDD Structure" by Oyamatsu discloses providing a mask with an opening over a substrate, implanting a dopant through the opening at an angle to the substrate to form a lightly doped drain region on one side without a corresponding source region on the other side, forming a gate in the opening which overlaps the lightly doped drain region, removing the mask, and implanting heavily doped source and drain regions using the gate as an implant mask. As another example, U.S. Pat. No. 5,286,664 entitled "Method For Fabricating The LDD-MOSFET" by Horiuchi discloses forming a gate, implanting lightly doped source and drain regions using the gate as an implant mask, forming a photoresist layer that covers the source side and exposes the drain side, depositing a single spacer on the drain side using liquid phase deposition (LPD) of silicon dioxide, stripping the photoresist, and implanting heavily doped source and drain regions using the gate and single spacer as an implant mask.

A drawback to these and other conventional asymmetrical IGFETs is that the heavily doped source and drain regions typically have identical dopant concentrations. Although the doping concentration of the heavily doped drain region may be constrained in order to reduce hot carrier effects, the doping concentration of the heavily doped source region need not be constrained in this manner. Furthermore, increasing the doping concentration of the heavily doped source region reduces the source-drain series resistance, thereby improving drive current.

Accordingly, a need exists for an improved asymmetrical IGFET which reduces both source-drain series resistance and hot carrier effects.

SUMMARY OF THE INVENTION

The present invention provides an asymmetrical IGFET with lightly and heavily doped drain regions and an ultra-heavily doped source region. Preferably, the lightly doped drain region and the ultra-heavily doped source region provide channel junctions, and the heavily doped drain region is spaced from the channel junctions.

By definition, the dopant concentration of the ultra-heavily doped source region exceeds that of the heavily doped drain region, and the dopant concentration of the heavily doped drain region exceeds that of the lightly doped drain region.

A method of making the IGFET includes providing a semiconductor substrate, providing a gate over the semiconductor substrate, implanting lightly doped source and drain regions into the substrate, forming a source-side spacer and a drain-side spacer in close proximity to opposing sidewalls of the gate, forming a masking layer that covers the drain-side spacer and includes an opening over the source-side spacer, removing the source-side spacer, and implanting a heavily doped drain region and an ultra-heavily doped source region into the substrate after removing the source-side spacer while the drain-side spacer is present, wherein the heavily doped drain region is implanted through the masking layer and the ultra-heavily doped source region is implanted through the opening in the masking layer.

Preferably, the method includes, in sequence, forming the gate, applying a first ion implantation to form the lightly doped source and drain regions, forming an insulating layer over the gate and the substrate, forming the source-side spacer and the drain-side spacer on the insulating layer, forming the masking layer, removing the source-side spacer, and applying a second ion implantation to form the ultra-heavily doped source region and the heavily doped drain region.

In this manner, the ultra-heavily doped source region has a greater doping concentration than that of the heavily doped drain region due to the masking layer, and a portion of the lightly doped drain region is protected from the second ion implantation due to the drain-side spacer.

In a first embodiment of the method, the masking layer and the spacers are identical materials, an etch mask is patterned over the masking layer, and a single dry etch forms the opening in the masking layer and removes the source-side spacer. As exemplary materials, the gate is polysilicon, the gate insulator and insulating layer are silicon dioxide, the masking layer and spacers are silicon nitride, and the etch mask is photoresist.

In a second embodiment of the method, the masking layer includes a first masking material beneath a second masking material, the first masking material and the spacers are identical materials, an etch mask is patterned over the second masking material, a first wet etch removes a portion of the second masking material, the etch mask is stripped, and a second wet etch removes a portion of the first masking material and the source-side spacer. As exemplary materials, the gate is polysilicon, the gate insulator and insulating layer and second masking material are silicon dioxide, the first masking material and spacers are silicon nitride, the etch mask is photoresist, the first wet etch is hydrofluoric acid, and the second wet etch is phosphoric acid.

Advantageously, the IGFET has low source-drain series resistance and reduces hot carrier effects. Moreover, only two source/drain implant steps are required to provide the lightly doped drain region, the heavily doped drain region and the ultra-heavily doped source region.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

In the drawings, depicted elements are not necessarily drawn to scale and like or similar elements may be designated by the same reference numeral throughout the several views.

Figure 1A:
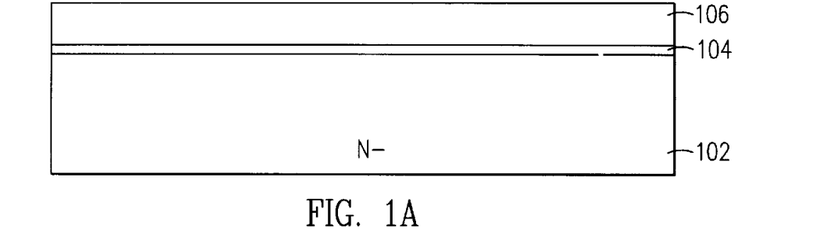
FIGS. 1A–1L show cross-sectional views of successive process steps for making an asymmetrical IGFET with a lightly doped and heavily doped drain regions and an ultra-heavily doped source region in accordance with a first embodiment of the invention.

In FIG. 1A, silicon substrate 102 suitable for integrated circuit manufacture includes a N-type well (shown) with a planar top surface in a P-type epitaxial surface layer (not shown) on a P+ base layer (not shown). The N-well has a phosphorus background concentration on the order of $1 \times 10^{16}$ atoms/cm$^3$, a <100> orientation and a resistivity of 12 ohm-cm. Substrate 102 can be subjected to a threshold voltage implant and a punch-through implant, as is conventional. For convenience of illustration, a single active region is shown, and dielectric isolation (such as field oxides or shallow trench refill) between adjacent active regions is not shown. Gate oxide 104, composed of silicon dioxide ($SiO_2$), is formed on the top surface of substrate 102 using tube growth at a temperature of 700 to 1000° C. in an $O_2$ containing ambient. Gate oxide 104 has a thickness of 50 angstroms. Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before a subsequent etch step by implanting boron difluoride ($BF_2$) with a dosage in the range of $1 \times 10^{15}$ to $5 \times 10^{15}$ atoms/cm$^2$ and an energy in the range of 2 to 80 kiloelectron-volts. However, it is generally preferred that polysilicon 106 be initially doped during a subsequent source/drain implant step.

Figure 1B:
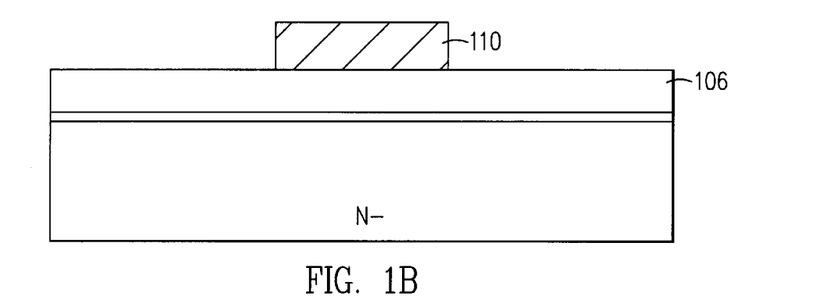

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle to obtain a first image pattern. Thereafter, photoresist 110 is developed and the irradiated portions are removed to provide openings in photoresist 110. The openings expose portions of polysilicon 106, thereby defining a gate.

Figure 1C:
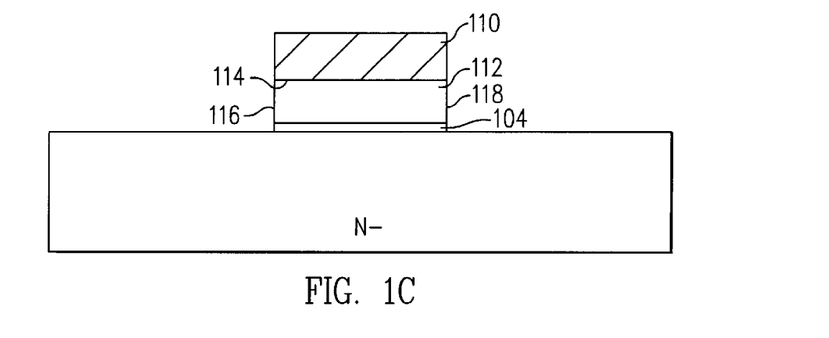

In FIG. 1C, an anisotropic etch is applied that removes the exposed portions of polysilicon 106 and the underlying portions of gate oxide 104. Preferably, a first dry etch is applied that is highly selective of polysilicon, and then a second dry etch is applied that is highly selective of silicon dioxide, using photoresist 110 as an etch mask. After etching occurs, the remaining portion of polysilicon 106 provides polysilicon gate 112 with top surface 114 and opposing vertical sidewalls 116 and 118. Polysilicon gate 112 has a length (between sidewalls 116 and 118) of 3500 angstroms.

Figure 1D:
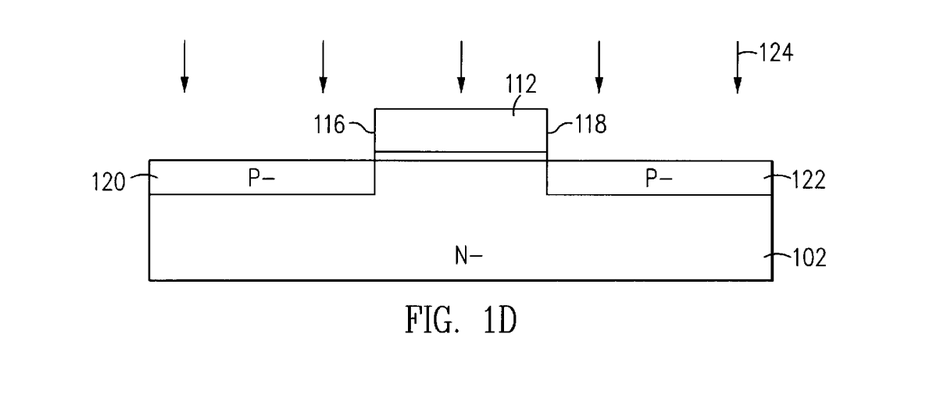

In FIG. 1D, photoresist 110 is stripped, and lightly doped source and drain regions 120 and 122 are implanted into substrate 102 by subjecting the structure to ion implantation of boron difluoride, indicated by arrows 124, at a dose in the range of $1 \times 10^{13}$ to $5 \times 10^{14}$ atoms/cm$^2$ and an energy in the range of 2 to 35 kiloelectron-volts. Polysilicon gate 112 provides an implant mask for the underlying portion of substrate 102. As a result, lightly doped source and drain regions 120 and 122 are substantially aligned with sidewalls 116 and 118, respectively. Lightly doped source and drain regions 120 and 122 are doped P− with a boron concentration of about $1 \times 10^{17}$ to $1 \times 10^{18}$ atoms/cm$^3$.

Figure 1E:
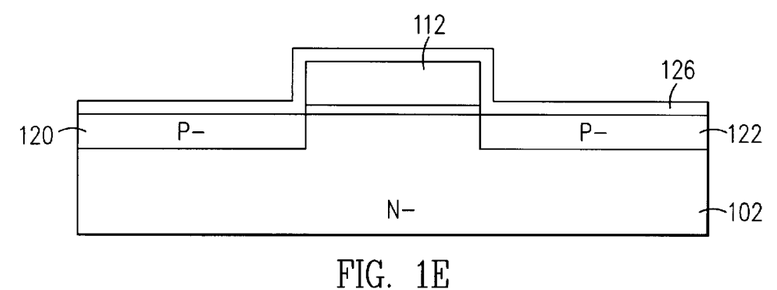

In FIG. 1E, pad oxide 126 is deposited over substrate 102 using a low temperature deposition process. Pad oxide 126 has a thickness of 100 angstroms and covers the top surface and sidewalls of polysilicon gate 112 along with the top surfaces of lightly doped source and drain regions 120 and 122.

Figure 1F:
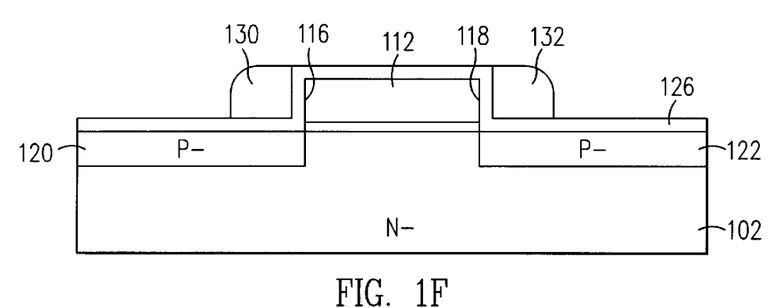

In FIG. 1F, a blanket layer of silicon nitride ($Si_3N_4$) with a thickness of 2000 angstroms is conformally deposited over the exposed surfaces by plasma enhanced chemical vapor deposition (PECVD) at a temperature in the range of 200 to 400° C. Thereafter, the entire silicon nitride layer is subjected to an anisotropic etch, such as a reactive ion etch, that is highly selective of silicon nitride with respect to silicon dioxide. The anisotropic etch forms nitride spacers 130 and 132 over lightly doped source and drain regions 120 and 122, respectively, and in close proximity to sidewalls 116 and 118, respectively. Thus, nitride spacer 130 forms a source-side spacer and nitride spacer 132 forms a drain-side spacer. Furthermore, pad oxide 126 provides a buffer that prevents nitride spacers 130 and 132 from contacting polysilicon gate 112 or substrate 102. Nitride spacers 130 and 132 each laterally extend 1200 angstroms across substrate 102.

Figure 1G:
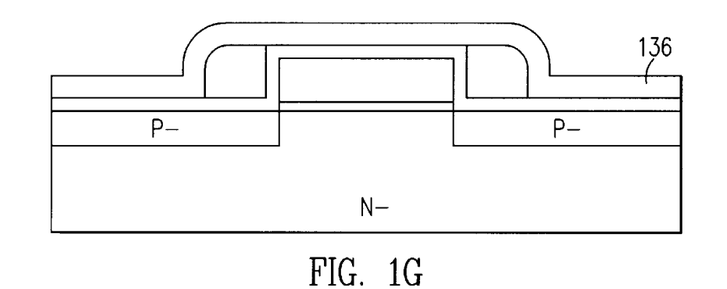

In FIG. 1G, a blanket layer of silicon nitride 136 with a thickness of 300 angstroms is conformally deposited over the exposed surfaces by plasma enhanced chemical vapor deposition at a temperature in the range of 200 to 400° C.

Figure 1H:
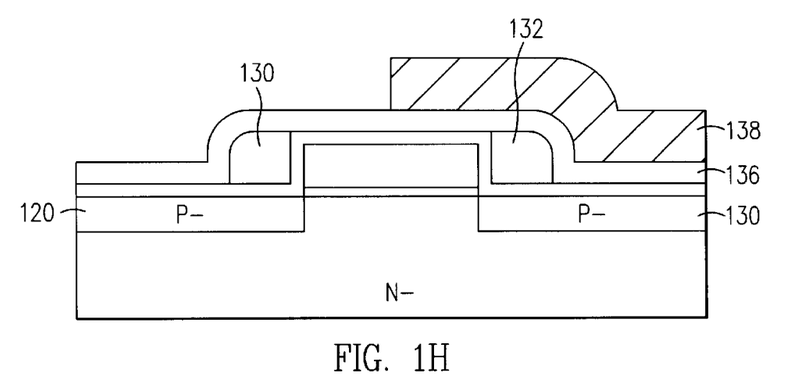

In FIG. 1H, photoresist 138 is deposited as a continuous layer on nitride layer 136 and selectively irradiated using the photolithographic system and a second reticle to obtain a second image pattern, and the irradiated portions are removed to provide an opening in photoresist 138. The opening is over lightly doped source region 120 and nitride spacer 130, whereas photoresist 138 covers lightly doped drain region 122 and nitride spacer 132.

Figure 1I:
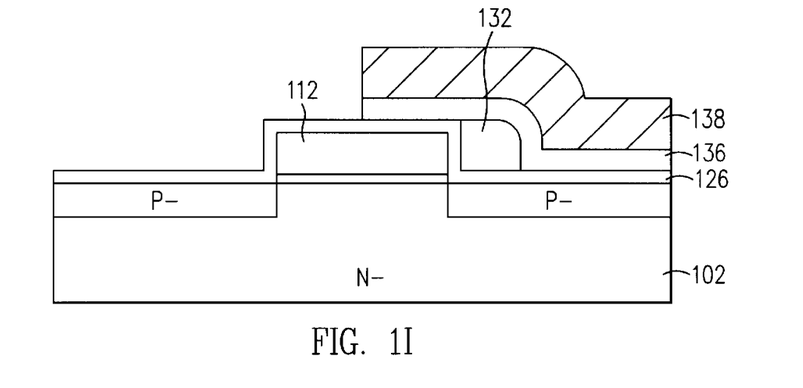

In FIG. 1I, nitride spacer 130 and the portion of nitride layer 136 beneath the opening in photoresist 138 are removed by applying a dry etch that is highly selective of silicon nitride with respect to silicon dioxide. Accordingly, pad oxide 126 outside photoresist 138 is exposed to but substantially unaffected by the etch. Photoresist 138 provides an etch mask for nitride spacer 132, and the combination of pad oxide 126 and photoresist 138 provide an etch mask for polysilicon gate 112 and substrate 102. Advantageously, since nitride spacer 130 and nitride layer 136 are identical materials, the dry etch is performed with a single etchant in a single etch step.

Figure 1J:
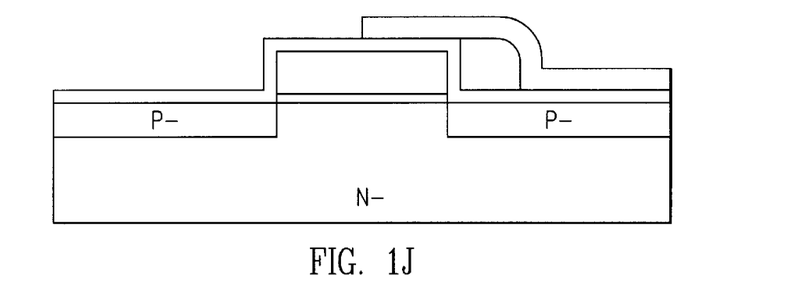

In FIG. 1J, photoresist 138 is stripped.

Figure 1K:
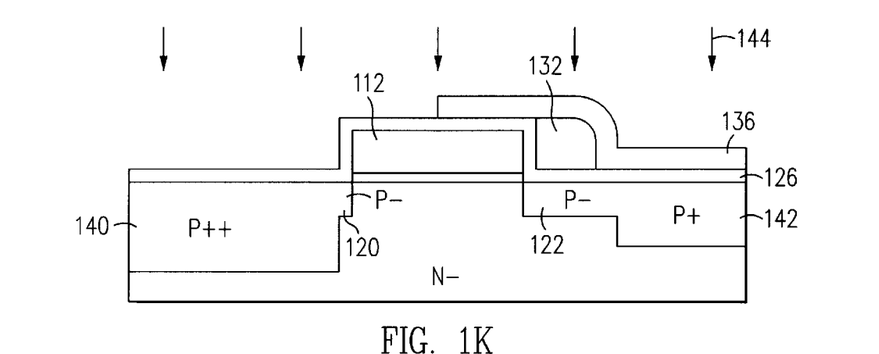

In FIG. 1K, ultra-heavily doped source region 140 and heavily doped drain region 142 are implanted into substrate 102 by subjecting the structure to ion implantation of boron difluoride, indicated by arrows 144, at a dose of $1 \times 10^{15}$ to $5 \times 10^{15}$ atoms/cm$^2$ and an energy in the range of 10 to 60 kiloelectron-volts. Polysilicon gate 112, the vertical portions of pad oxide 126 (adjacent to the opposing sidewalls of polysilicon gate 112), nitride spacer 132, and the vertical portion of nitride layer 136 (adjacent to the outer edge of nitride spacer 132) provide an implant mask that blocks essentially all ions impinging thereon from passing therethrough. The horizontal portions of nitride layer 136 provide a partial implant mask that allows the majority of ions impinging thereon to pass therethrough, but blocks a substantial amount of ions impinging thereon from passing therethrough. The horizontal portions of pad oxide 126 allow most of the ions impinging thereon to pass therethrough. Thus, ultra-heavily doped source region 140 has a greater dopant concentration than that of heavily doped drain region 142 due to nitride layer 136, and lightly doped drain region 122 beneath nitride spacer 132 is essentially unaffected by boron difluoride 144 due to nitride spacer 132. Ultra-heavily doped source region 140 is doped P++ with a boron concentration of about $5 \times 10^{19}$ to $5 \times 10^{20}$ atoms/cm$^3$, and heavily doped drain region 142 is doped P+ with a boron concentration of about $1 \times 10^{19}$ to $1 \times 10^{20}$ atoms/cm$^3$. Preferably, the dopant concentration of heavily doped drain region 142 is at least 10 times that of lightly doped drain region 122, and the dopant concentration of ultra-heavily doped source region 140 is at least 1.5 times that of heavily doped drain region 142. Finally, as is seen, ultra-heavily doped source region 140 and heavily doped drain region 142 have greater depths than those of lightly doped source and drain regions 120 and 122, ultra-heavily doped source region 140 has a greater depth than that of heavily doped drain region 142, and a small portion of lightly doped source region 120 remains beneath a vertical portion of pad oxide 126 adjacent to polysilicon gate 112.

Figure 1L:
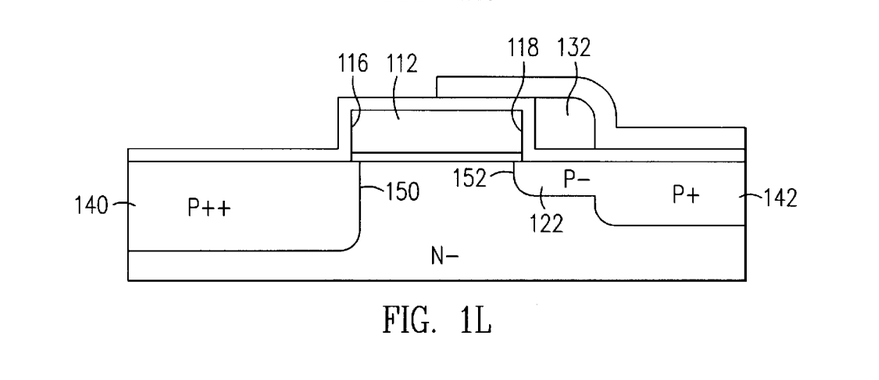

In FIG. 1L, a rapid thermal anneal on the order of 900 to 1050° C. for 10 to 30 seconds is applied to remove crystalline damage and to drive-in and activate the implanted dopants. The boron diffuses rapidly during the anneal. As a result, ultra-heavily doped source region 140 diffuses into and essentially eliminates the remaining portion of lightly doped source region 120 to form a source, and lightly doped drain region 122 and heavily doped drain region 142 form a drain for a PMOS device controlled by polysilicon gate 112. Ultra-heavily doped source region 140 and lightly doped drain region 122 extend slightly beneath polysilicon gate 112, and heavily doped drain region 142 extends slightly beneath nitride spacer 132. Ultra-heavily doped source region 140 provides a first channel junction 150 that is substantially aligned with sidewall 116, and lightly doped drain region 122 provides a second channel junction 152 that is substantially aligned with sidewall 118. In addition, heavily doped drain region 142 is spaced from channel junction 152.

FIGS. 2A–2M show cross-sectional views of successive process steps for making an asymmetrical IGFET with a lightly doped and heavily doped drain regions and an ultra-heavily doped source region in accordance with a second embodiment of the invention. In the first embodiment, a dry etch is used to remove nitride spacer 130 and a portion of nitride layer 136. Wet etching often has higher throughput than dry etching. However, a typical wet etch for silicon nitride includes hot phosphoric acid, and photoresist tends to rapidly decompose in hot phosphoric acid and contaminate the strip tank. Therefore, in the first embodiment, a wet etch would not be preferred for removing nitride spacer 130 and the portion of nitride layer 136. In the second embodiment, the masking layer includes an oxide layer on a nitride layer. Photoresist is patterned on the oxide layer, and the source-side portion of the oxide layer is etched in hydrofluoric acid using the photoresist as an etch mask. Thereafter, the photoresist is stripped, and the source-side nitride spacer and source-side portion of the nitride layer are etched in hot phosphoric acid using the oxide layer as an etch mask. Therefore, in the second embodiment, wet etches are used to remove the source-side spacer and source-side portion of the masking layer. Unless otherwise noted, the elements of the second embodiment (e.g., substrate 202, gate oxide 204, etc.) are similar to elements of the first embodiment (e.g., substrate 102, gate oxide 104, etc.), and the description of related elements and process steps need not be repeated.

Figure 2A:
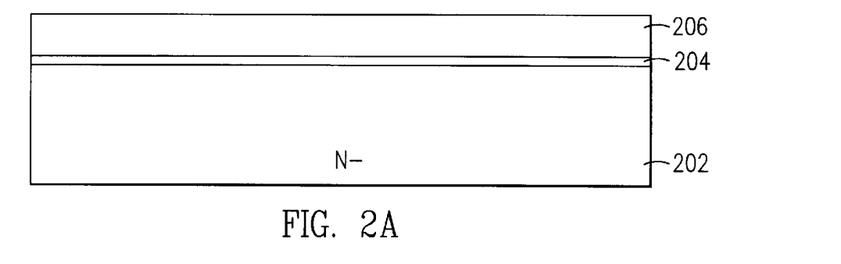
FIGS. 2A–2M show cross-sectional views of successive process steps for making an asymmetrical IGFET with a lightly doped and heavily doped drain regions and an ultra-heavily doped source region in accordance with a second embodiment of the invention.

In FIG. 2A, silicon substrate 202 suitable for integrated circuit manufacture is provided. Substrate 202 includes a N-type well as shown. A blanket layer of gate oxide 204 with a thickness of 50 angstroms is formed on substrate 202, and undoped polysilicon 206 with a thickness of 2000 angstroms is deposited on gate oxide 204.

Figure 2B:
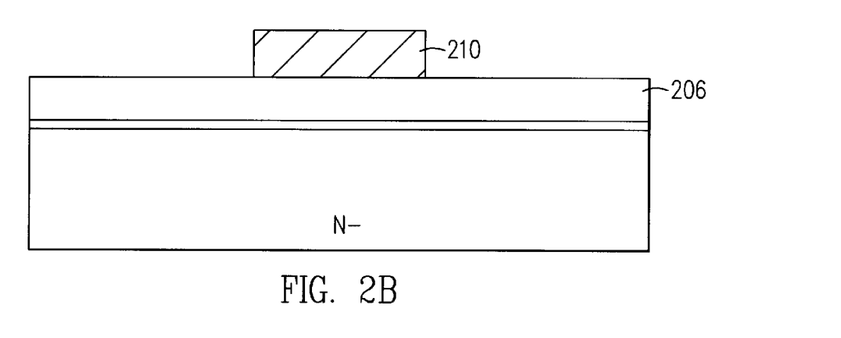

In FIG. 2B, photoresist 210 is deposited on polysilicon 206. A photolithographic system uses a first reticle to irradiate photoresist 210 with a first image pattern. Thereafter, the irradiated portions of photoresist 210 are removed, and photoresist 210 defines a gate.

Figure 2C:
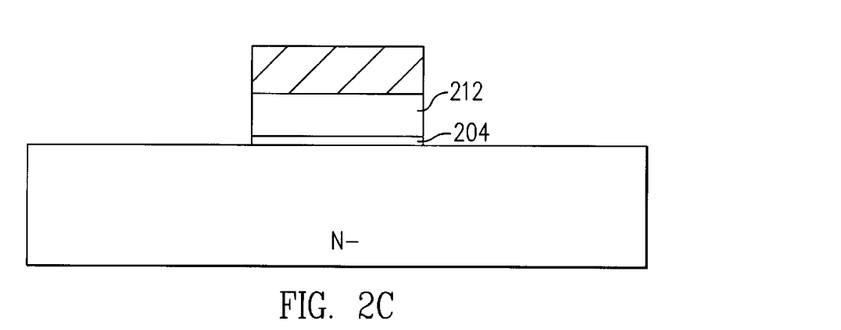

In FIG. 2C, an anisotropic etch is applied that removes the exposed portions of polysilicon 206 and the underlying portions of gate oxide 204. After etching occurs, the remaining portion of polysilicon 206 provides polysilicon gate 212.

Figure 2D:
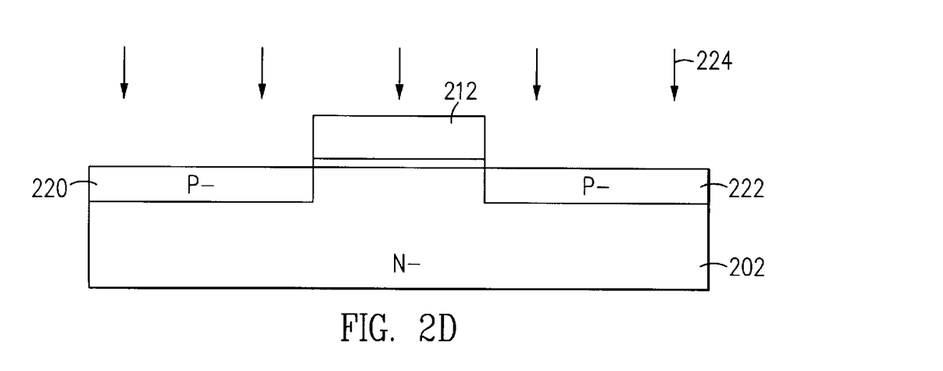

In FIG. 2D, photoresist 210 is stripped, and lightly doped source and drain regions 220 and 222 are implanted into substrate 202 by subjecting the structure to ion implantation of boron difluoride, indicated by arrows 224. Lightly doped source and drain regions 220 and 222 are doped P− and are substantially aligned with the opposing sidewalls of polysilicon gate 212.

Figure 2E:
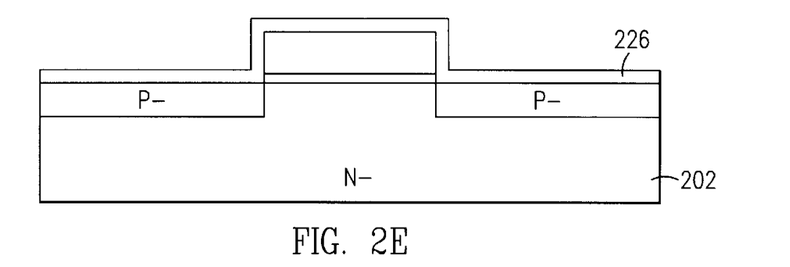

In FIG. 2E, pad oxide 226 with a thickness of 100 angstroms is deposited over substrate 202.

Figure 2F:
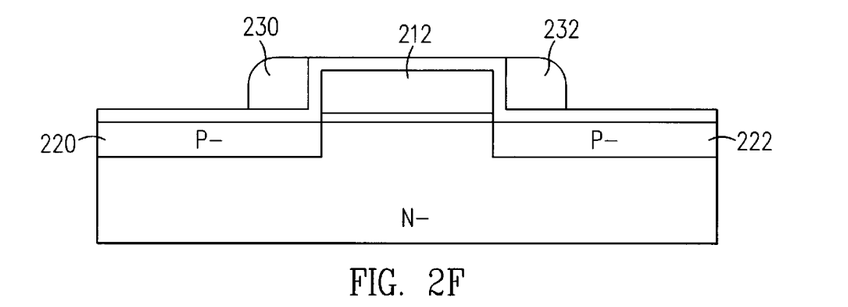

In FIG. 2F, a blanket layer of silicon nitride with a thickness of 2000 angstroms is conformally deposited over the exposed surfaces, and thereafter the entire silicon nitride layer is subjected to an anisotropic etch to form nitride spacers 230 and 232 over lightly doped source and drain regions 220 and 222, respectively, and in close proximity to the opposing sidewalls of polysilicon gate 212.

Figure 2G:
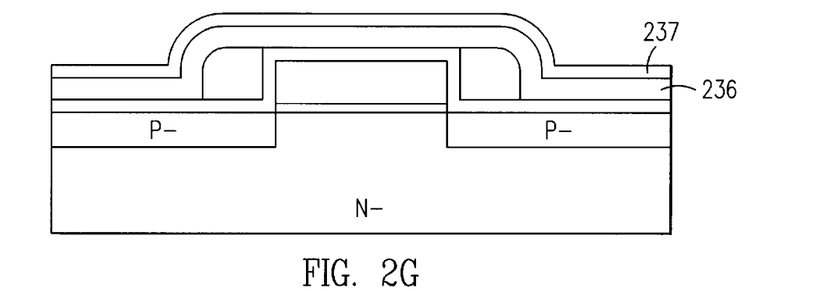

In FIG. 2G, a blanket layer of silicon nitride 236 with a thickness of 200 angstroms is conformally deposited over the exposed surfaces. Thereafter, a blanket layer of silicon dioxide 237 with a thickness of 100 angstroms is conformally deposited on nitride layer 236 using a low temperature deposition process. Thus, nitride layer 236 and oxide layer 237 have a combined thickness of 300 angstroms, and replace the 300 angstrom thick nitride layer 136 in the first embodiment.

Figure 2H:
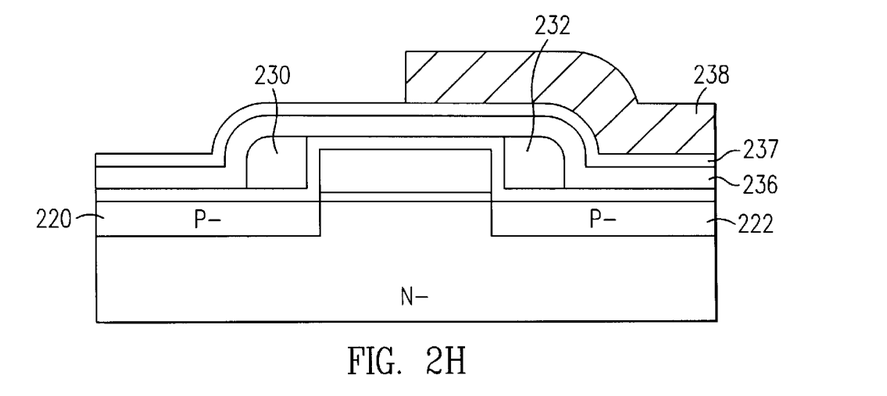

In FIG. 2H, photoresist 238 is deposited as a continuous layer on oxide layer 237 and selectively irradiated using the photolithographic system and a second reticle to obtain a second image pattern, and the irradiated portions are removed to provide an opening in photoresist 238. The opening is over lightly doped source region 220 and nitride spacer 230, whereas photoresist 238 covers lightly doped drain region 222 and nitride spacer 232.

Figure 2I:
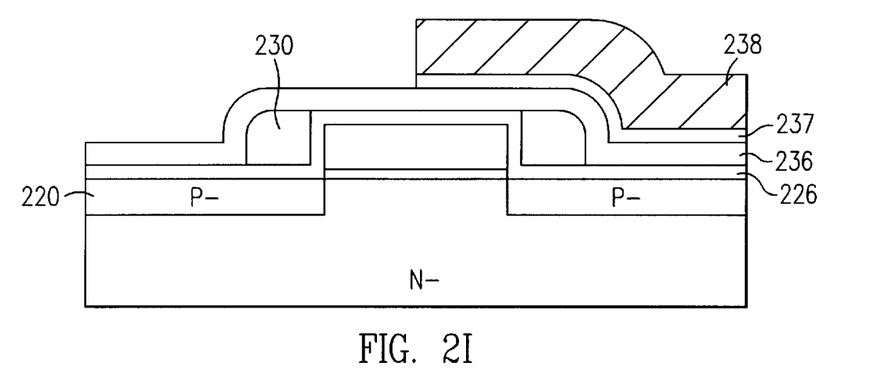

In FIG. 2I, the portion of oxide layer 237 beneath the opening in photoresist 238 is removed by applying a wet etch of hydrofluoric acid that is highly selective of silicon dioxide with respect to silicon nitride and photoresist. Accordingly, an opening is formed in oxide layer 237 which is over lightly doped source region 220 and nitride spacer 230. In addition, photoresist 238 and nitride layer 236 outside photoresist 238 are exposed to but substantially unaffected by the hydrofluoric acid and provide an etch mask for pad oxide 226.

Figure 2J:
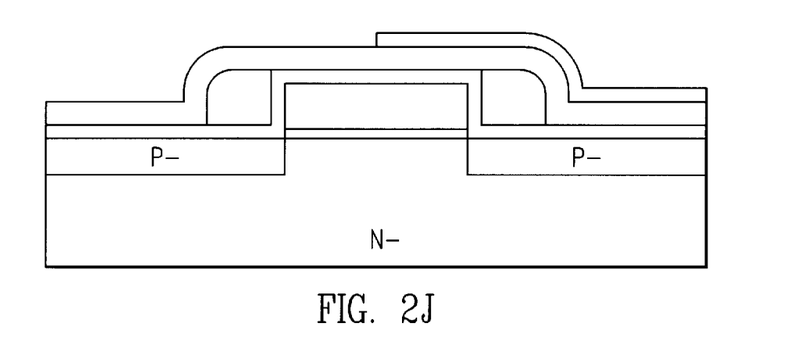

In FIG. 2J, photoresist 238 is stripped.

Figure 2K:
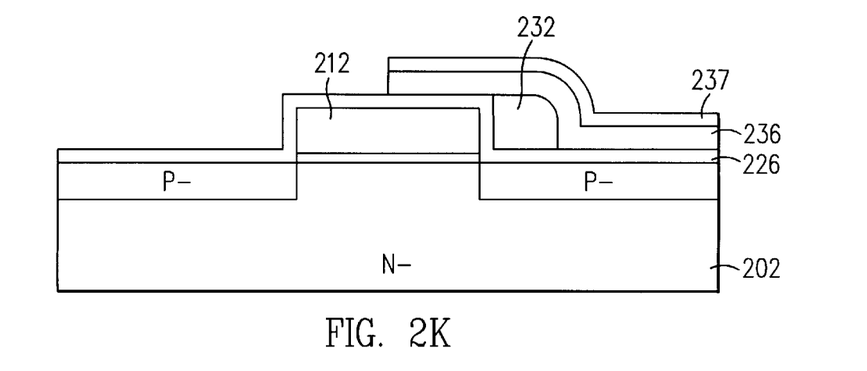

In FIG. 2K, nitride spacer 230 and the portion of nitride layer 236 beneath the opening in oxide layer 237 are removed by applying a wet etch of hot phosphoric acid that is highly selective of silicon nitride with respect to silicon dioxide. Accordingly, oxide layer 237 and pad oxide 226 outside oxide layer 237 are exposed to but substantially unaffected by the hot phosphoric acid. Oxide layer 237 provides an etch mask for nitride spacer 232, and the combination of pad oxide 226 and oxide layer 237 provide an etch mask for polysilicon gate 212 and substrate 202. Advantageously, the hot phosphoric acid removes nitride spacer 230 and the portion of nitride layer 236 outside oxide layer 237 without contacting photoresist.

Figure 2L:
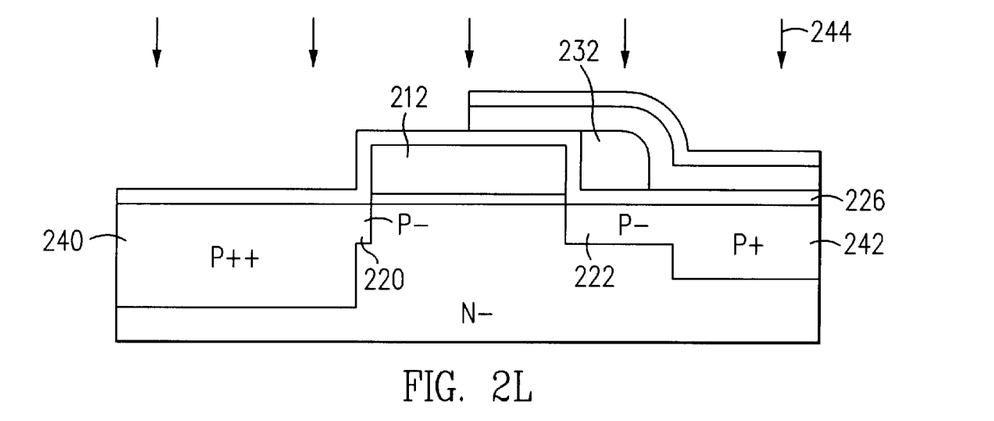

In FIG. 2L, ultra-heavily doped source region 240 and heavily doped drain region 242 are implanted into substrate 202 by subjecting the structure to ion implantation of boron difluoride, indicated by arrows 244. Polysilicon gate 212, the vertical portions of pad oxide 226, nitride spacer 232, and the vertical portions of nitride layer 236 and oxide layer 237 provide an implant mask that blocks essentially all ions impinging thereon from passing therethrough. The horizontal portions of nitride layer 236 and oxide layer 237 provide a partial implant mask (similar to nitride layer 136 in the first embodiment) that allows the majority of ions impinging thereon to pass therethrough, but blocks a substantial amount of ions impinging thereon from passing therethrough. The horizontal portions of pad oxide 226 allow most of the ions impinging thereon to pass therethrough. Thus, ultra-heavily doped source region 240 has a greater dopant concentration than that of heavily doped drain region 242 due to nitride layer 236 and oxide layer 237, and lightly doped drain region 222 beneath nitride spacer 232 is essentially unaffected by boron difluoride 244 due to nitride spacer 232. Ultra-heavily doped source region 240 is doped P++, and heavily doped drain region 242 is doped P+.

Figure 2M:
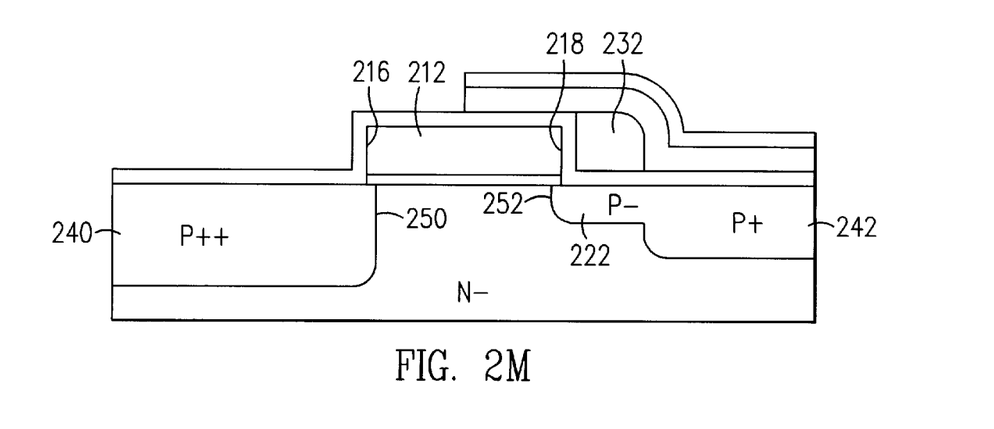

In FIG. 2M, a rapid thermal anneal on the order of 900 to 1050° C. for 10 to 30 seconds is applied to remove crystalline damage and to drive-in and activate the implanted dopants. As a result, ultra-heavily doped source region 240 diffuses into and essentially eliminates the remaining portion of lightly doped source region 220 to form a source, and lightly doped drain region 222 and heavily doped drain region 242 form a drain for a PMOS device controlled by polysilicon gate 212. Ultra-heavily doped source region 240 and lightly doped drain region 222 extend slightly beneath polysilicon gate 212, and heavily doped drain region 242 extends slightly beneath nitride spacer 232. Ultra-heavily doped source region 240 provides a first channel junction 250 that is substantially aligned with sidewall 216, and lightly doped drain region 222 provides a second channel junction 252 that is substantially aligned with sidewall 218. In addition, heavily doped drain region 242 is spaced from channel junction 252.

Further processing steps in the fabrication of IGFETs typically include forming salicide contacts on the gate, source and drain, forming a thick oxide layer over the active region, forming contact windows in the oxide layer to expose the salicide contacts, forming interconnect metallization in the contact windows, and forming a passivation layer over the interconnect metallization. Source-side and drain-side spacers are often necessary to prevent bridging the salicide contacts. In the present invention, this can be accomplished by removing the masking layer and the drain-side spacer after the second source/drain implant step, forming another source-side spacer and drain-side spacer in close proximity to the opposing sidewalls of the gate, and then depositing a refractory metal and reacting it to form the salicide contacts. In addition, earlier or subsequent high-temperature process steps can be used to supplement or replace the desired anneal, activation, and drive in functions. These further processing steps are conventional. Likewise the principal processing steps disclosed herein may be combined with other steps apparent to those skilled in the art.

Preferably, the IGFET includes a source that consists of the ultra-heavily doped source region, and a drain that consists of the lightly doped and heavily doped drain regions. It is also preferred that the dopant concentration of the ultra-heavily doped source region is in the range of 1.5 to 10 times that of the heavily doped drain region, and the dopant concentration of the heavily doped drain region is in the range of 10 to 100 times that of the lightly doped drain region.

The present invention includes numerous variations to the embodiments described above. For instance, as a variation to the first embodiment, nitride layer 136 can be omitted, and a very thin photoresist layer 138 can provide the etch mask that protects nitride spacer 132 when nitride spacer 130 is removed and also provide the masking layer present during the second source/drain implant step so that ultra-heavily doped source region 140 has a greater doping concentration than that of heavily doped drain region 142.

Furthermore, the gate insulator can remain outside the gate during the source/drain implant steps. The source may include a very small lightly doped source region adjacent to the first channel junction as long as the lightly doped source region, if any, is far smaller than the lightly doped drain region. The pad oxide can be formed before the first source/drain implant step, in which case the entire lightly doped source region becomes exposed to the second source/drain implant step. The lightly doped source and drain regions can be formed either before or after forming the ultra-heavily doped source region and the heavily doped drain region. The spacers and masking layer can include or consist of various materials, such as polysilicon, silicon nitride, oxynitride and aluminum, and need not include identical materials. Other insulating layers can replace the pad oxide. Alternatively, the pad oxide can be omitted, and the source-side and drain-side spacers can be formed adjacent to the opposing sidewalls of the gate. Of course, the gate can be various conductors and the gate insulator can be various dielectrics. Suitable P-type dopants include boron, boron species (such as boron difluoride) and combinations thereof If an N-channel device is desired, suitable N-type dopants include arsenic, phosphorus and combinations thereof.

The invention is particularly well-suited for fabricating N-channel MOSFETs, P-channel MOSFETs, and other types of IGFETs, particularly for high-performance microprocessors where high circuit density is essential. Although only a single device has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an asymmetrical IGFET, comprising the steps of:
   providing a semiconductor substrate;
   providing a gate over the semiconductor substrate;
   implanting lightly doped source and drain regions into the substrate,
   forming a source-side spacer and a drain-side spacer to opposing sidewalls of the gate;
   forming a masking layer that covers the drain-side spacer and includes an opening over the source-side spacer;
   removing the source-side spacer; and
   implanting a heavily doped drain region and an ultra-heavily doped source region into the substrate after removing the source-side spacer while the drain-side spacer is present, wherein the heavily doped drain region is implanted through the masking layer and the ultra-heavily doped source region is implanted through the opening in the masking layer.

2. The method of claim 1, wherein forming the spacers includes depositing a spacer material over the substrate, and applying an anisotropic etch to the spacer material.

3. The method of claim 1, wherein the masking layer is photoresist.

4. The method of claim 1, wherein forming the masking layer includes depositing a masking material over the substrate, forming a photoresist layer over the masking material wherein the photoresist layer covers the drain-side spacer and includes an opening over the source-side spacer, and removing a portion of the masking material beneath the opening in the photoresist layer.

5. The method of claim 1, wherein forming the masking layer includes depositing a first masking material over the substrate, depositing a second masking material over the first masking material, forming a photoresist layer over the second masking material wherein the photoresist layer covers the drain-side spacer and includes an opening over the source-side spacer, removing a portion of the second masking material beneath the opening in the photoresist layer to provide an opening in the second masking material, stripping the photoresist layer, and then removing a portion of the first masking material beneath the opening in the second masking material, such that the masking layer includes the first and second masking materials.

6. The method of claim 1, wherein forming the masking layer includes forming a masking material over the source-side spacer and the drain-side spacer, and removing a portion of the masking material over the source-side spacer.

7. The method of claim 6, including removing the portion of the masking material and the source-side spacer using a single etchant.

8. The method of claim 7, wherein the masking layer and the source-side spacer are identical materials.

9. The method of claim 6, including removing the portion of the masking material and the source-side spacer using separate etchants.

10. The method of claim 9, wherein the masking layer and the source-side spacer include different materials.

11. The method of claim 1, wherein while implanting the heavily doped drain region, a horizontal portion of the masking layer through which the heavily doped drain region is implanted allows a majority of ions impinging thereon to pass therethrough and blocks a remaining portion of the ions impinging thereon from passing therethrough.

12. The method of claim 1, wherein a dopant concentration of the ultra-heavily doped source region exceeds that of the heavily doped drain region, and a dopant concentration of the heavily doped drain region exceeds that of the lightly doped drain region.

13. The method of claim 1, including applying a first ion implantation to form the lightly doped source and drain regions, and then applying a second ion implantation to form the heavily doped drain region and the ultra-heavily doped source region.

14. The method of claim 1, including applying a first ion implantation to form the heavily doped drain region and the ultra-heavily doped source region, and then applying a second ion implantation to form the lightly doped source and drain regions.

15. The method of claim 1, including forming a source that includes the ultra-heavily doped source region, and forming a drain that includes the lightly doped and heavily doped drain regions, using two source/drain implant steps.

16. The method of claim 1, including forming a source that consists of the ultra-heavily doped source region, and forming a drain that consists of the lightly doped and heavily doped drain regions.

17. The method of claim 1, wherein the steps of:

providing a semiconductor substrate;

providing a gate over the semiconductor substrate;

implanting lightly doped source and drain region into the substrate;

forming an insulating layer over the gate and the substrate;

forming a source-side spacer and a drain-side spacer to opposing sidewalls of the gate;

forming a masking layer that covers the drain-side spacer and includes an opening over the source-side spacer;

removing the source-side spacer; and implanting a heavily doped drain region and an ultra-heavily doped source region into the substrate after removing the source-side spacer while the drain-side spacer is present, wherein the heavily doped drain region is implanted through the masking layer and the ultra-heavily doped source region is implanted through the opening in the masking layer, are performed in sequence.

18. A method of making an asymmetrical IGFET, comprising the steps of:

providing a semiconductor substrate;

forming a gate insulator on the substrate;

forming a gate with opposing sidewalls on the gate insulator;

applying a first ion implantation to form lightly doped source and drain regions in the substrate using the gate as an implant mask for an underlying portion of the substrate;

forming an insulating layer over the gate and the substrate;

forming a source-side spacer and a drain-side spacer on the insulating layer and to the opposing sidewalls of the gate, wherein the source-side spacer is over the lightly doped source region and the drain-side spacer is over the lightly doped drain region;

forming a masking material over the source-side spacer and the drain-side spacer;

removing a portion of the masking material over the source-side spacer to form a masking layer that covers the drain-side spacer and includes an opening over the source-side spacer;

removing the source-side spacer without removing the drain-side spacer; and then applying a second ion implantation to form an ultra-heavily doped source region and a heavily doped drain region, wherein the ultra-heavily doped source region is implanted through the opening in the masking layer, the heavily doped drain region is implanted through the masking layer, the drain-side spacer provides an implant mask for an underlying portion of the lightly doped drain region, and the ultra-heavily doped source region has a greater doping concentration than that of the heavily doped drain region due to the masking layer.

19. The method of claim 18, wherein a source consists of the ultra-heavily doped source regions, and a drain consists of the lightly doped and heavily doped drain regions.

20. The method of claim 18, wherein the lightly doped drain region and the ultra-heavily doped source region are aligned with the opposing sidewalls of the gate.

21. The method of claim 18, wherein a dopant concentration of the heavily doped drain region is at least 10 times that of the lightly doped drain region, and a dopant concentration of the ultra-heavily doped source region is at least 1.5 times that of the heavily doped drain region.

22. The method of claim 18, wherein the masking material and the spacers are identical materials.

23. The method of claim 22, including forming an etch mask over the masking material, and removing the portion of the masking material and the source-side spacer using a single etchant.

24. The method of claim 18, wherein the masking material and the spacers include different materials.

25. The method of claim 24, including depositing a first masking material over the substrate, depositing a second masking material over a first masking material, forming an etch mask over the second masking material, removing a portion of the second masking material using a first wet etch, removing the etch mask, and then removing a portion of the first masking material using a second wet etch, wherein unetched portions of the first and second masking materials form the masking layer.

26. The method of claim 25, wherein the first masking material and the spacers are identical materials, and the second masking material and the insulating layer are identical materials.

27. The method of claim 18, wherein the gate is polysilicon, the gate insulator and insulating layer are silicon dioxide, and the spacers are selected from the group consisting of polysilicon, silicon nitride, oxynitride, and aluminum.

28. A method of making an asymmetrical IGFET, comprising the following steps:

providing a semiconductor substrate;

forming a gate oxide on the substrate;

forming a polysilicon gate on the gate oxide;

applying a first ion implantation to form lightly doped source and drain regions in the substrate that are aligned with opposing sidewalls of the gate;

forming a pad oxide over the substrate, wherein the pad oxide covers a top surface and the opposing sidewalls of the gate;

depositing a spacer material on the pad oxide, wherein the spacer material is selected from the group consisting of polysilicon, silicon nitride, silicon oxynitride and aluminum;

applying an anisotropic etch to the spacer material to form a source-side spacer and a drain-side spacer on the pad oxide layer and to the opposing sidewalls of the gate, wherein the source-side spacer is over the lightly doped source region and the drain-side spacer is over the lightly doped drain region;

forming a masking layer that covers the drain-side spacer and includes an opening over the source-side spacer;

removing the source-side spacer without removing the drain-side spacer; and then applying a second ion implantation to form an ultra-heavily doped source region and a heavily doped drain region, wherein the ultra-heavily doped source region is implanted through the opening in the masking layer, the heavily doped region drain region is implanted through the masking layer, the ultra-heavily doped source region has a greater doping concentration than that of the heavily doped drain region due to the masking layer, and a portion of the lightly doped drain region is protected from the second ion implantation due to the drain-side spacer.

29. The method of claim 28, wherein the ultra-heavily doped source region provides a first channel junction, and the lightly doped drain region provides a second channel junction.

30. The method of claim 29, wherein the first and second channel junctions are aligned with the opposing sidewalls of the gate.

31. The method of claim 28, wherein during the second ion implantation, a portion of the masking layer, outside the gate and the drain-side spacer, through which the heavily doped drain region is implanted, allows a majority of ions impinging thereon to pass therethrough and blocks a remaining portion of the ions impinging thereon from passing therethrough.

32. The method of claim 28, wherein the masking layer is photoresist.

33. The method of claim 28, wherein forming the masking layer includes:

depositing a masking layer over the substrate;

forming a photoresist over the masking material, wherein the photoresist layer covers the drain-side spacer and includes an opening over the source-side spacer; and applying an etch using the photoresist layer as an etch mask to remove a portion of the masking material beneath the opening in the photoresist layer, wherein an unetched portion of the masking material forms the masking layer.

34. The method of claim 33, wherein the masking material and the spacer material are silicon nitride.

35. The method of claim 28, wherein forming the masking layer includes:

depositing a first masking material over the substrate;

depositing a second masking material over the first masking material;

forming a photoresist layer over the second masking material, wherein the photoresist layer covers the drain-side spacer and includes an opening over the source-side spacer;

applying a first wet etch using the photoresist layer as an etch mask to remove a portion of the second masking material beneath the opening in the photoresist layer and leave intact an unetched portion of the second masking material;

stripping the photoresist layer; and then applying a second wet etch using the unetched portion of the second masking material as an etch mask to remove a portion of the first masking material and leave intact an unetched portion of the first masking material, wherein the unetched portions of the first and second masking materials form the masking layer.

36. The method of claim 28, wherein the steps of:

providing a semiconductor substrate:

forming a gate oxide on the substrate;

forming a polysilicon gate on the gate oxide;

applying a first ion implantation to form lightly doped source and drain regions in the substrate that are aligned with opposing sidewalls of the gate;

forming a pad oxide over the substrate, wherein the pad oxide covers a top surface and the opposing sidewalls of the gate;

depositing a spacer material on the pad oxide, wherein the spacer material is selected from the group consisting of polysilicon, silicon nitride, silicon oxynitride and aluminum;

applying an anisotropic etch to the spacer material to form a source-side spacer and a drain-side spacer on the pad oxide layer and to the opposing sidewalls of the gate, wherein the source-side spacer is over the lightly doped source region and the drain-side spacer is over the lightly doped drain region;

forming a masking layer that covers drain-side spacer and includes an opening over the source-side spacer;

removing the source-side spacer without removing the drain-side spacer; and then applying a second ion implantation to form an ultra-heavily doped source region and a heavily doped drain region, wherein the ultra-heavily doped source region is implanted through the opening in the masking layer, the heavily doped region drain region is implanted through the masking layer, the ultra-heavily doped source region has a greater doping concentration than that of the heavily doped drain region due to the masking layer, and a portion of the lightly doped drain region is protected from the second ion implantation due to the drain-side spacer;

are performed in sequence.

* * * * *